(12) United States Patent
Chien et al.

(10) Patent No.: US 6,468,838 B2
(45) Date of Patent: Oct. 22, 2002

(54) METHOD FOR FABRICATING A MOS TRANSISTOR OF AN EMBEDDED MEMORY

(75) Inventors: Sun-Chieh Chien; Chien-Li Kuo, both of Hsin-Chu (TW)

(73) Assignee: United Microelectronic Corp., Hsin-Chu (TW)

( * ) Notice: Subject to any disclaimer, the term of this patent is extended or adjusted under 35 U.S.C. 154(b) by 48 days.

(21) Appl. No.: 09/798,857

(22) Filed: Mar. 1, 2001

(65) Prior Publication Data

US 2002/0132429 A1 Sep. 19, 2002

(51) Int. Cl.[7] ..................... H01L 21/335; H01L 21/8232
(52) U.S. Cl. ..................... 438/142; 438/258; 438/275; 438/200; 438/201; 438/241
(58) Field of Search ............................. 438/142, 157, 438/163, 201, 200, 241, 275, 258

(56) References Cited

U.S. PATENT DOCUMENTS

| | | | | |
|---|---|---|---|---|
| 5,879,981 A | * | 3/1999 | Tanigawa | 438/241 |
| 6,074,908 A | * | 6/2000 | Huang | 438/241 |
| 6,281,050 B1 | * | 8/2001 | Sakagami | 438/142 |
| 6,200,834 B1 | * | 3/2002 | Bronner et al. | 438/142 |
| 6,352,891 B1 | * | 3/2002 | Kasai | 438/241 |
| 6,235,574 B1 | * | 5/2002 | Tobben et al. | 438/241 |

* cited by examiner

Primary Examiner—Carl Whitehead, Jr.
Assistant Examiner—Volita Russell
(74) Attorney, Agent, or Firm—Winston Hsu (57) ABSTRACT

The present invention provides a method for manufacturing a MOS transistor of an embedded memory on the surface of semiconductor wafer. The method of present invention is first to define a memory array area and a periphery circuit region on the surface of the semiconductor wafer and to depose a dielectric layer, a undoped polysilicon layer, a silicide layer, a doped polysilicon layer, a protection layer and a photoresist layer sequentially. Next, a plurality of gate patterns on the memory array area is defined and the protection layer is etched to the surface of the doped polysilicon layer. Then a plurality of gate patterns on the periphery circuit region is defined in and the doped polysilicon layer, the silicide layer and the undoped polysilicon layer are etched to the surface of the dielectric layer so as to form gates of each MOS transistors in the memory array area and periphery circuit region. Finally a spacer and source and drain region are formed around each gate.

14 Claims, 7 Drawing Sheets

METHOD FOR FABRICATING A MOS TRANSISTOR OF AN EMBEDDED MEMORY

BACKGROUND OF THE INVENTION

1. Field of the Invention

The present invention relates to a method of fabricating a MOS transistor of an embedded memory.

2. Description of the Prior Art

In the present computer industry, logic devices are used for data or information processing, while memory devices are used for data storage. These two types of devices can be found in almost all computers,-however they are usually found on specific chips, reserved for either logic or memory applications. Systems in which logic and memory devices are packaged separately, data signals between the two may have to pass through several levels of packaging, which can lead to undesirable propagation delays. In addition, the manufacturing costs for fabricating wafers producing only logic chips and wafers producing only memory chips are greater than if both logic and memory applications were to be incorporated on the same chip.

Figure 1:
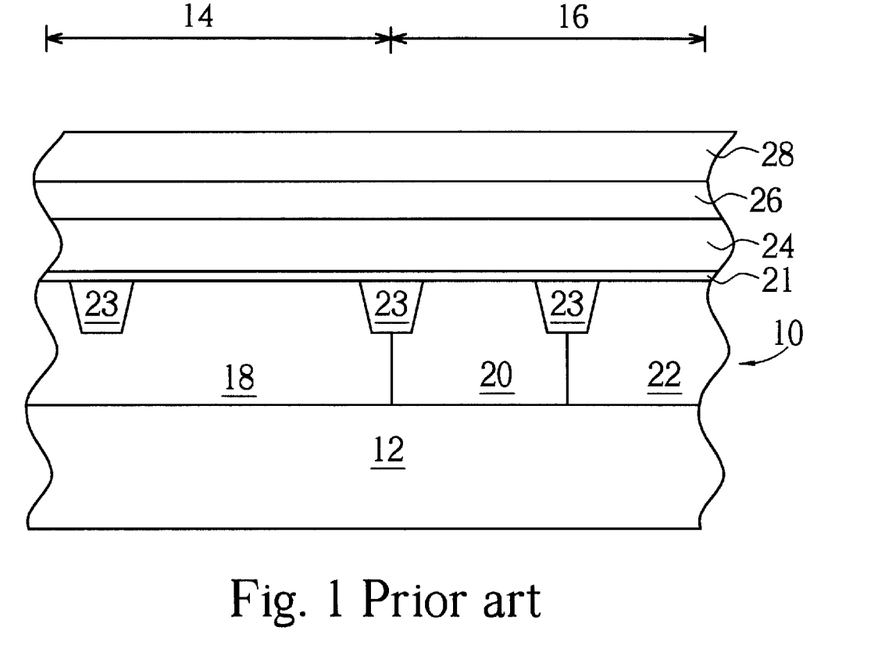
FIG. 1 to FIG. 5 are cross-sectional diagrams of manufacturing a MOS transistor of an embedded memory by a prior art method.

So with the increasing integration and consideration of performance and cost, the semiconductor industry has been motivated to integrate both memory cell array and high-speed logic circuit elements onto one chip forming a so-called embedded memory. The effect is a reduction in the surfaces of chips as well as an increase in the speed of signal processing. Please refer to FIG. 1 to FIG. 5. FIG. 1 to FIG. 5 are cross-sectional diagrams of a prior art method for manufacturing a metal-oxide-semiconductor (MOS) transistor of an embedded memory on a semiconductor wafer 10. As shown in FIG. 1, the surface of the silicon substrate 12 is divided into a memory array area 14 and a periphery circuit region 16. The memory array area 14 contains a cell well 18, and the periphery circuit region 14 contains at least one N-well 20 and at least one P-well 22. Each region is separated by several shallow trench isolation structures 23.

Figure 2:
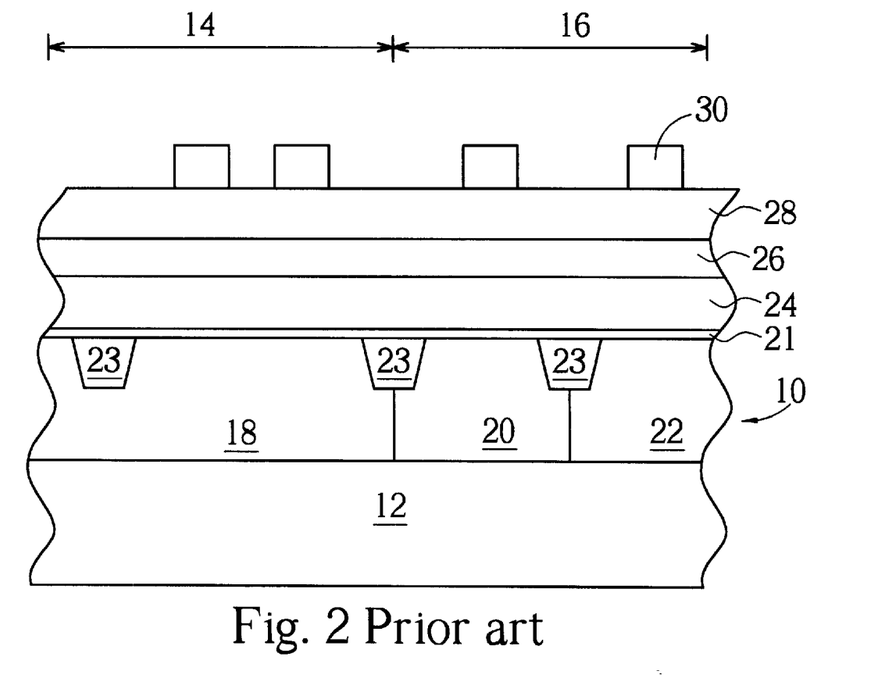

The prior art method first involves forming a gate oxide layer 21, a polysilicon layer 24, a polycide layer 26 and cap layer 28 composed of silicon nitride, respectively, on the surface of the semiconductor wafer 10. Then, as shown in FIG. 2, a photoresist layer 30 is formed above the cap layer 28 followed by the use of a lithographic process to simultaneously define gate patterns of both the memory array area 14 and the periphery circuit region 16 in the photoresist layer 30. Thereafter, the patterned photoresist layer 30 is used as a mask layer to perform an etching process for removing the cap layer 28, the polycide layer 26 and the polysilicon layer 24 down to the surface of the gate oxide layer 21 so as to simultaneously form a plurality of gates 32 above the cell well 18 of the memory array area 14 and a plurality of gates 34 above the N-well 20 and P-well 22 of the periphery circuit region 16.

Figure 3:
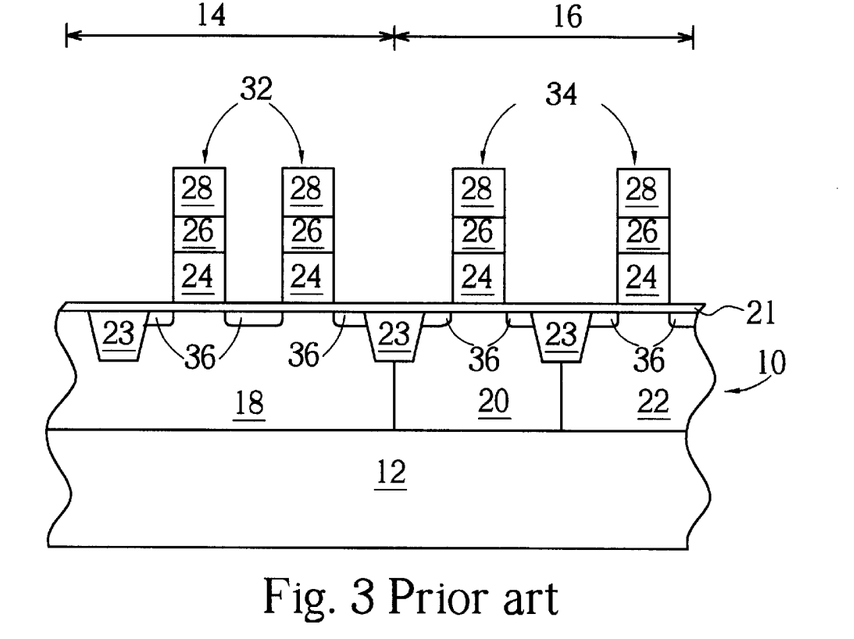

As shown in FIG. 3, the photoresist layer 30 above the cap layer 28 is completely removed, followed by performing an ion implantation process to form a doped region (not shown) on the surface of the silicon substrate 12 adjacent to the gates 32, 34. Thereafter, a rapid thermal process (RTP) is performed to drive dopants in the doped region into the silicon substrate 12 so as to form lightly doped drain (LDD) 36 of each MOS transistor.

Figure 4:
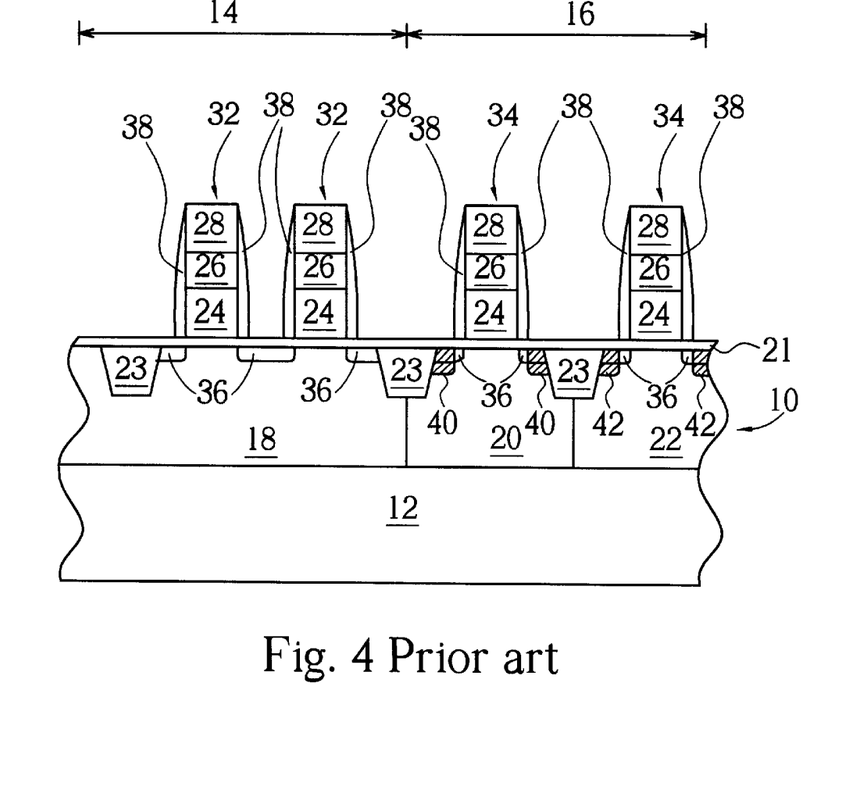

As shown in FIG. 4, a silicon nitride layer (not shown) is deposited on the semiconductor wafer 10 followed by performing an an-isotropic etching process to etch back portions of the silicon nitride layer to form a spacer 38 around each gate 32, 34 of the memory array area 14 and the periphery circuit region 16, respectively. Then, an ion implantation process is performed to form a source and drain of each MOS transistor in the periphery circuit region 16. A photoresist layer is first formed to cover the memory array area 14 and gates 32, 34 of the N-well 20. Then, N-type dopants are used to implant the surface of the P-well 22 so as to form a doped region 42, followed by removal of the photoresist layer. Next, another photoresist layer is formed to completely cover the memory array area 14 and the gate 34 of the P-well 22. Then, P-type dopants are used to implant the N-well 20 of the periphery circuit region 16 so as to form a doped region 40. Thereafter, a rapid thermal process is used to drive dopants of each doped region 40, 42 into the silicon substrate 12 so as to form the source and the drain of each MOS transistor in the periphery circuit region 16.

Figure 5:
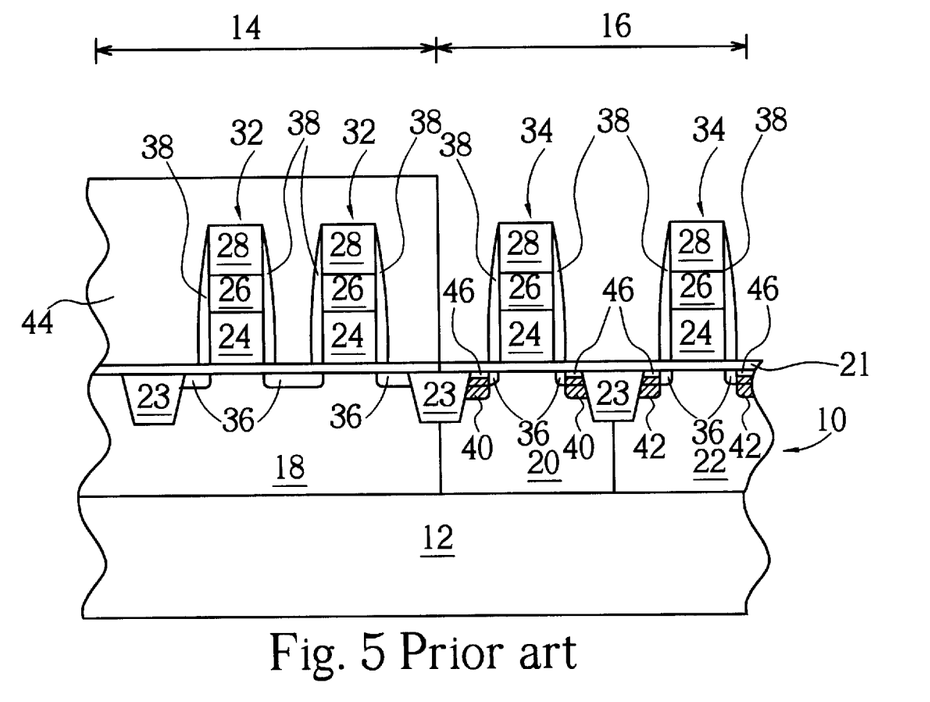

Finally, as shown in FIG. 5, a salicide block (SAB) layer 44 is formed on the silicon substrate 12 of the memory array area 14. Then, a self-aligned silicide process is performed in the periphery circuit region 16 for forming a salicide layer 46 on the surface of each source and drain so as to finish the process of manufacturing a MOS transistor of an embedded memory according to the prior art method.

To satisfy the requirements of integration, yield rate and process properties, a self-aligned contact (SAC) process is now widely used in the manufacturing process of the memory array area to increase misalignment tolerances. However, for simultaneously forming gates in both the periphery circuit region and the memory array area, with the consideration of electrical properties of the periphery circuit region, a polycide layer must be directly deposited on the polysilicon layer for reducing the resistance of the gate structure in the periphery circuit region. A self-aligned silicide operation is also used to form a salicide layer on each source and drain for reducing the contact interface resistance of the MOS transistors. Generally speaking, the polycide layer formed by deposition has a greater resistivity than that of the salicide layer. Hence, the electrical performance of the gate structure composed of both the polycide layer and a cap layer in the periphery circuit region differs to that of the gate structure composed of the salicide layer in the conventional periphery circuit region to result in the unfitness of the cell library established by logic circuits.

SUMMARY OF THE INVENTION

It is the primary object of the present invention to provide a method of manufacturing a MOS transistor of an embedded memory that retains the cap layer required in the self-aligned contact (SAC) process of the memory array area, and simultaneously removes the cap layer in the periphery circuit region so as to form a salicide layer on the top surface of the gate and reduce the gate resistance of the periphery circuit region.

The method of the present invention is to first define a memory array area and a periphery circuit region on the surface of the semiconductor wafer. Next, a first dielectric layer, an undoped polysilicon layer, a silicide layer, a doped polysilicon layer, a protection layer and a first photoresist layer are deposited, respectively, onto the wafer. Then, a lithographic and an etching process are performed to form a plurality of gate patterns in the protection layer on the memory array area as well as to remove the protection layer on the periphery circuit region to the surface of the doped polysilicon layer. Then, a lithography process is again used to form a plurality of gate patterns in the second photoresist layer formed on the periphery circuit region. Thereafter, the second photoresist layer and the protection layer on the memory array area are used as hard masks to etch the doped polysilicon layer, the silicide layer and the undoped polysilicon layer to the surface of the dielectric layer to simultaneously form the gates of the MOS transistors in the memory array area as well as the periphery circuit region.

Next, the second photoresist layer is removed and an ion implantation process is performed to form the lightly doped drains of each MOS transistor. Thereafter, a silicon nitride layer and a second dielectric layer are formed, respectively, on the surface of the semiconductor wafer. Then, a lithography and an etching process are performed to remove the second dielectric layer and portions of the silicon nitride layer on the periphery circuit region to form a spacer on the sidewalls of each gate in the periphery circuit region. Finally, an ion implantation process is performed to form the sources and drains of each MOS transistor in the periphery circuit region.

The method of fabricating a MOS transistor of an embedded memory in the present invention integrates both the SAC process in the memory array area and the salicide process in the periphery circuit region. Additionally, the electrical performance of the gates in the periphery circuit region is not affected.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 6:
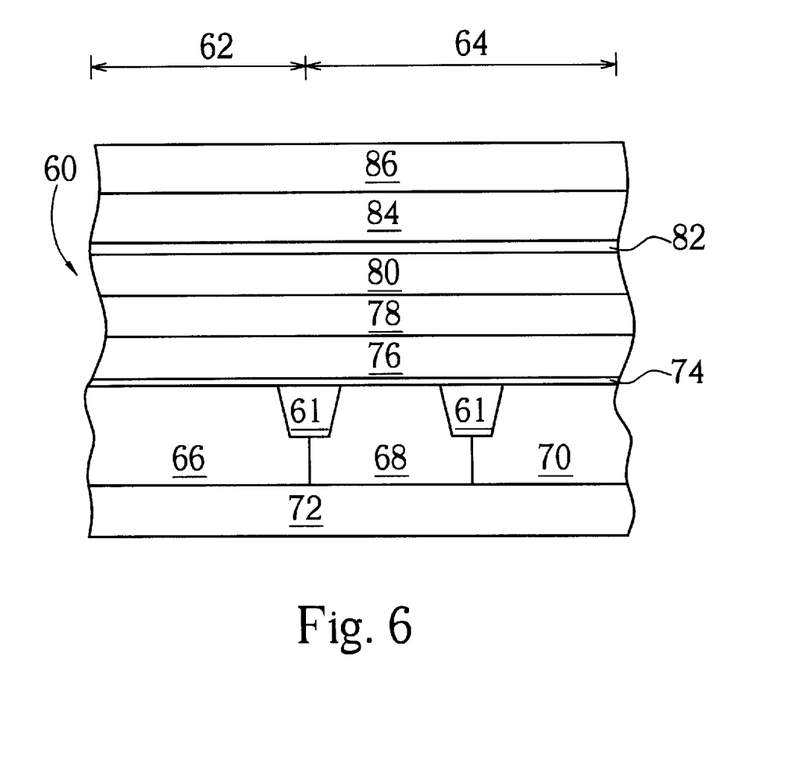
FIG. 6 to FIG. 14 are cross-sectional diagrams of manufacturing a MOS transistor of an embedded memory by the present invention.

Please refer to FIG. 6 to FIG. 14. FIG. 6 to FIG. 14 are cross-sectional diagrams of manufacturing a MOS transistor of an embedded memory on a semiconductor wafer 60 by the present invention. As shown in FIG. 6, the semiconductor wafer 60 includes a silicon substrate 72, defined by both a memory array area 62 and a periphery circuit region 64 on the surface of the silicon substrate 72. The memory array area 62 comprises at least one cell-well 66 while the periphery circuit region 64 comprises at least one N-well 68 and at least one P-well 70. Several shallow trench isolation 61 structures are formed to separate each region.

Figure 7:
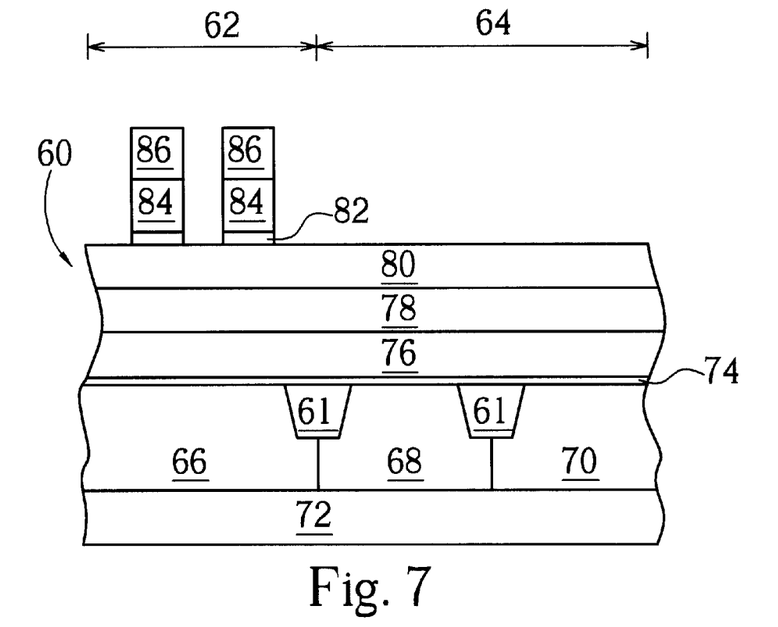

In the present invention, a silicon oxide dielectric layer 74 is first deposited on the semiconductor wafer 60 followed by the deposition of an undoped polysilicon layer 76, a silicide layer 78, a doped polysilicon layer 80, a silicon oxynitride layer 82 serving as an anti-reflection coating (ARC) layer, a silicon nitride layer 84 serving as a protection layer and a photoresist layer 86, respectively. Next, as shown in FIG. 7, a photolithographic process is performed to define a plurality of gate patterns in the photoresist layer 86 on the memory array area 62. Then, patterns in the photoresist layer 86 are used as hard masks to etch the silicon nitride layer 84 and the silicon oxynitride layer 82 to the surface of the doped polysilicon layer 80.

Figure 8:
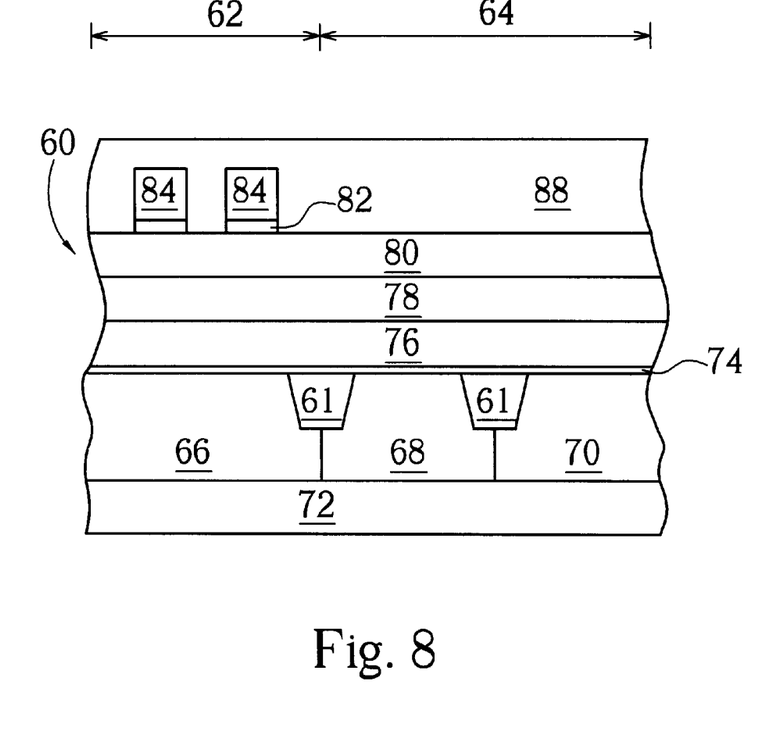
Figure 9:
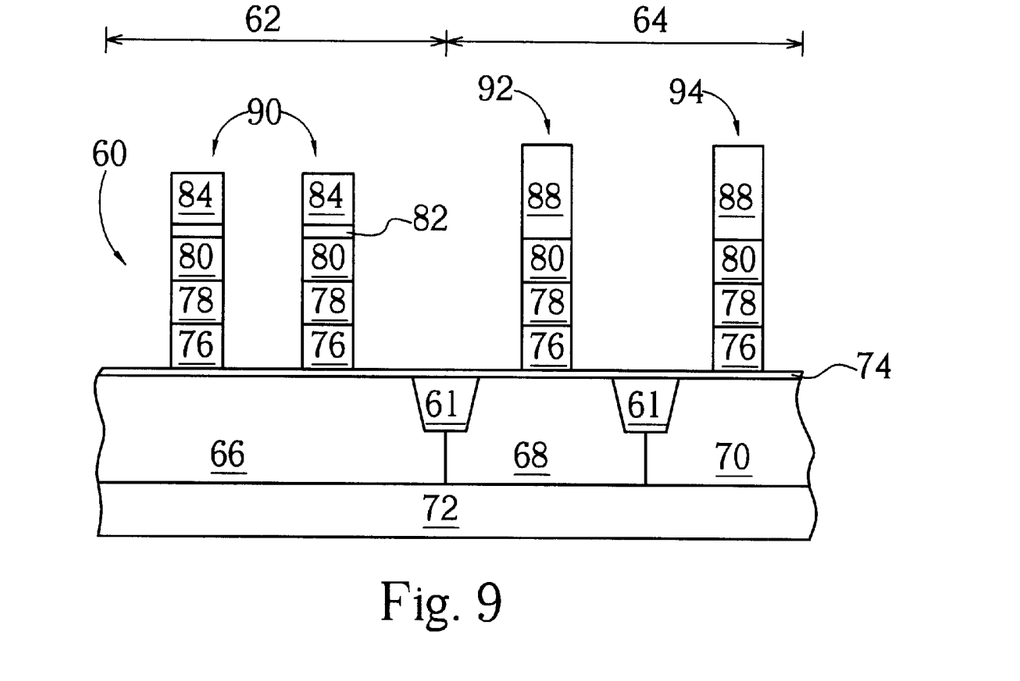

Thereafter, as shown in FIG. 8, the photoresist layer 86 is removed and another photoresist layer 88 is formed on the semiconductor wafer 60. Then, a photolithographic process is performed to define a plurality of gate patterns in the photoresist layer 88 on the periphery circuit region 64. Next, the patterns in the photoresist layer 88 and the silicon nitride layer 84 remaining in the memory array area 62 are used as hard masks to etch the polysilicon layer 80, the silicide layer 78 and the undoped polysilicon layer 76 to the surface of the silicon dioxide dielectric layer 74. Consequently, the gates 90,92,94 of each MOS transistor are formed in the memory array area 62 and in the periphery circuit region 64, as shown in FIG. 9.

Figure 10:
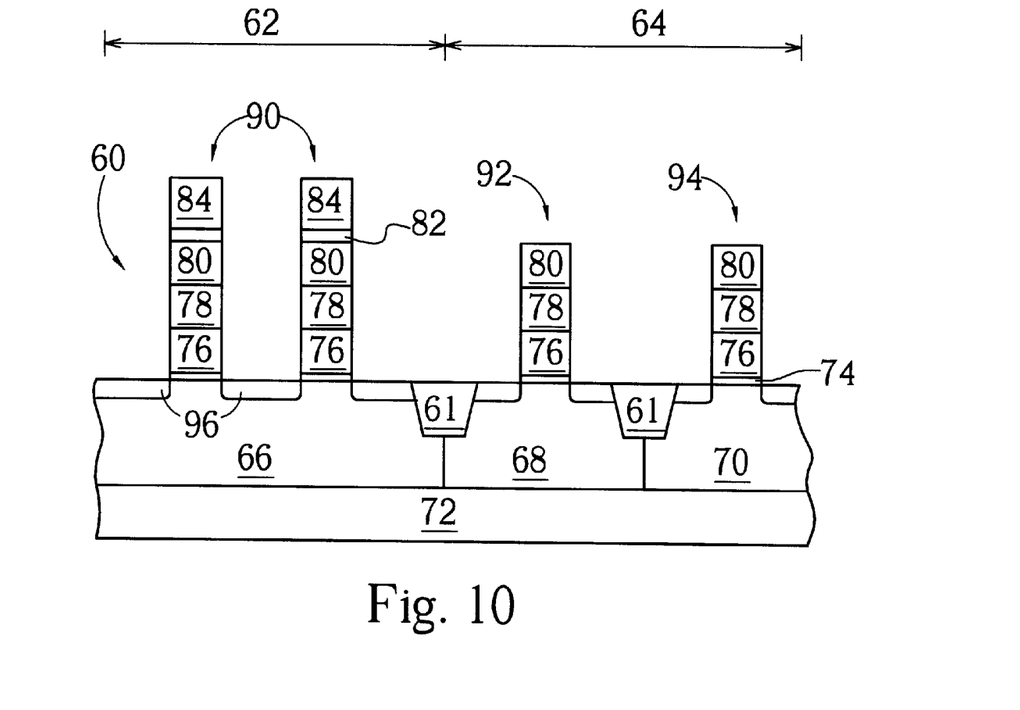
Figure 11:
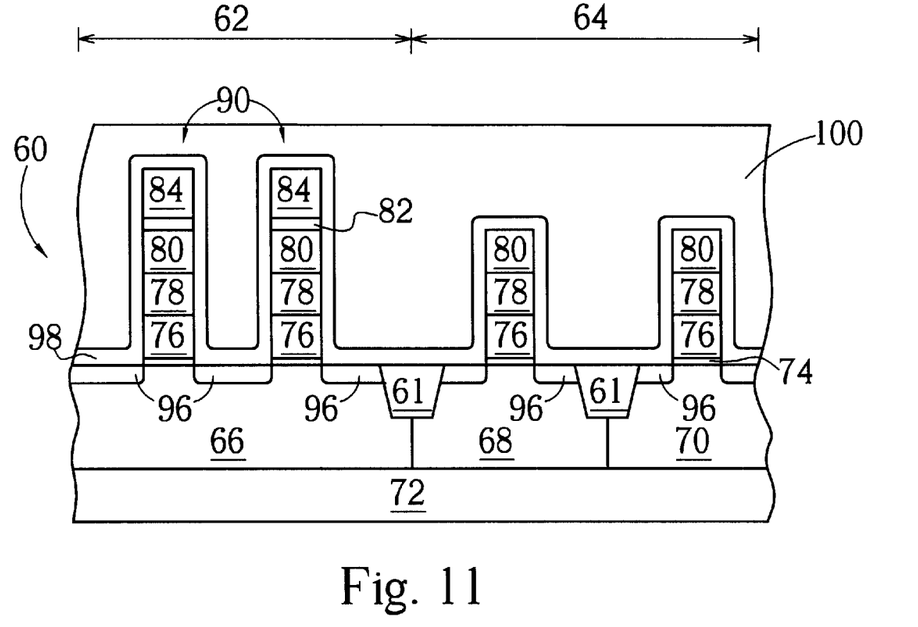
Figure 12:
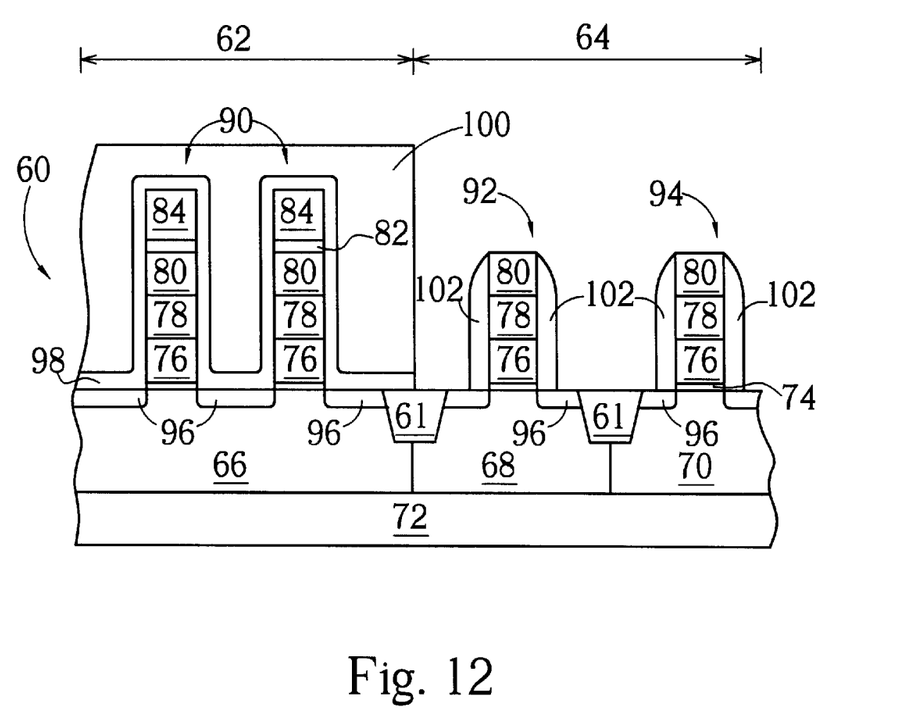

As shown in FIG. 10, the photoresist layer 88 is removed and an ion implantation process is performed to form the lightly doped drain (LDD) 96 of each MOS transistor. Then as shown in FIG. 11, a silicon nitride layer 98 and a dielectric layer 100 are formed respectively on the surface of the semiconductor wafer 60. Thereafter, as shown in FIG. 12, a lithographic and an etching process are used to remove the dielectric layer 100 on the periphery circuit region 64 as well as portions of the silicon nitride layer 98 to form a spacer 102 on the sidewalls of each gate 92,94 in the periphery circuit region 64.

Figure 13:
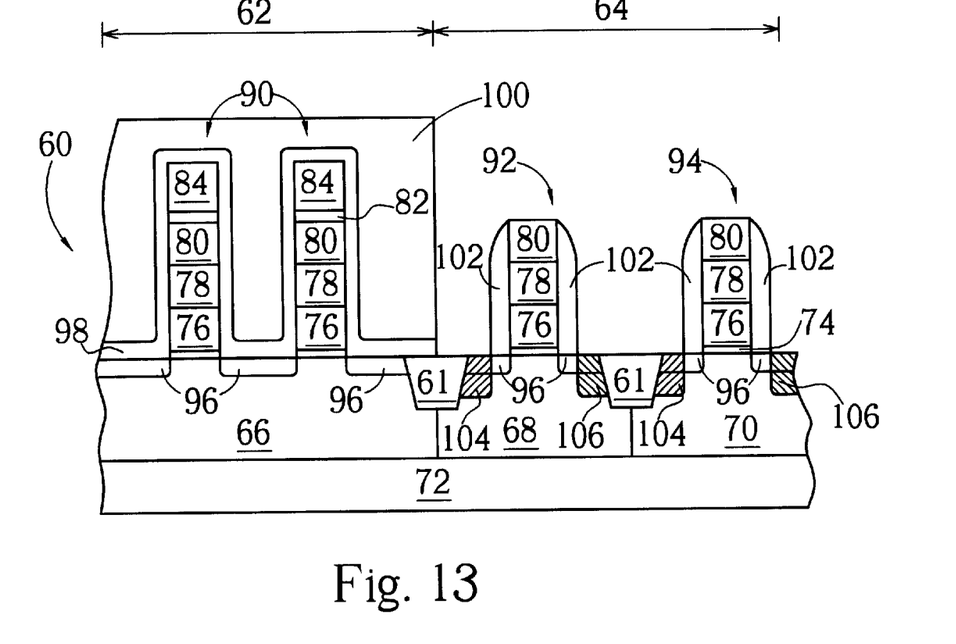

Then, as shown in FIG. 13, two ion implantation processes are performed, respectively, in the differently doped regions to form source 104 and drain 106 of PMOS and NMOS transistors on the N-well 68 and P-well 70 in the periphery circuit region 64. The two ion implantation processes performed in the differently doped regions are also used to dope the undoped polysilicon layer 76 of each gate 92,94 on the P-well 70 and on the N-well 68.

Figure 14:
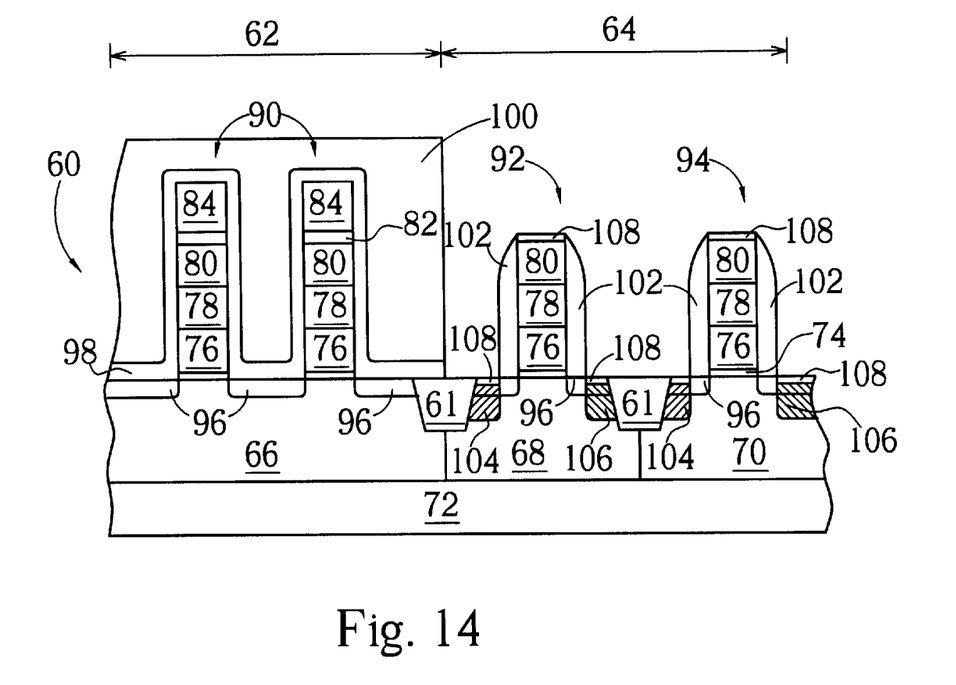

As shown in FIG. 14, after the formation of the source 104 and the drain 106 of each MOS transistor in the periphery circuit region 64, a metal layer (not shown) comprised of Co is formed on the surface of the semiconductor wafer 60. The metal layer covers the surfaces of the sources 102, the drains 104, and the gates 92,94 in the periphery circuit region 64. Then, a first rapid thermal process (RTP) is performed at a temperature between 400° C. and 600° C. for a duration of 10 to 50 seconds to diffuse Co atoms of the metal layer to the surface of each source 104, drain 106 and gate 92,94. Then, a wet etching process is performed to remove the unreacted metal layer from the surface of the semiconductor wafer 60. Finally, a second rapid thermal process (RTP) is performed at a temperature between 600° C. and 800° C. for a duration of 10 to 50 seconds to form a salicide layer 108 on the surface of each source 104, drain 106 and gates 92,94 in the periphery circuit region 64. Ti, Ni, or Mo can replace Co as the metal in the metal layer.

The method of the present invention for manufacturing a MOS transistor of an embedded memory involves first removing a silicon nitride layer and a silicon oxynitride layer in the periphery circuit region, followed by simultaneously defining the gate patterns in the memory array area and the periphery circuit region. Hence, the cap layer required in the SAC process of the memory array area is retained, and simultaneously, the cap layer in the periphery circuit region is removed so as to form a salicide layer on the top surface of the gate for reducing its resistance.

In contrast to the prior art method of fabricating a MOS transistor of an embedded memory, the gate structure of the periphery circuit region manufactured by the present invention contains a salicide layer with a resistance of about 10–25 $\mu\Omega$-cm. However, the gate structure of the periphery circuit region manufactured by the prior art method uses a polycide layer as a gate conducting layer with a resistance of about 14–70 $\mu\Omega$-cm. Thus, in the present invention, gate resistance is significantly reduced to improve the electrical performance of the MOS transistor.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for fabricating a metal oxide semiconductor (MOS) transistor of an embedded memory, the method comprising:

providing a semiconductor wafer with both a memory array area and a periphery circuit region defined on the surface of a silicon substrate of the semiconductor wafer;

forming a first dielectric layer, an undoped polysilicon layer, a silicide layer, a doped polysilicon layer, a protection layer and a first photoresist layer respectively on the surface of the semiconductor wafer;

performing a first photolithographic process so as to define a plurality of gate patterns in the first photoresist layer above the memory array area;

using the gate patterns in the first photoresist layer as a hard mask to etch the protection layer down to the surface of the doped polysilicon layer;

removing the first photoresist layer;

forming a second photoresist layer on the surface of the semiconductor wafer;

performing a second photolithographic process to define a plurality of gate patterns in the second photoresist layer above the periphery circuit region;

using the gate patterns of the second photoresist layer and the remaining portions of the protection layer above the memory array area as a hard mask to etch the doped polysilicon layer, the silicide layer and the undoped polysilicon layer down to the surface of the dielectric layer so as to form the gates for each MOS transistor in the memory array area and in the periphery circuit region;

removing the second photoresist layer;

performing a first ion implantation process to form a lightly doped drain (LDD) for each MOS transistor;

forming a silicon nitride layer and a second dielectric layer respectively on the surface of the semiconductor wafer;

performing an etching process to remove the second dielectric layer above the periphery circuit region and etching portions of the silicon nitride layer to form a spacer adjacent to each gate in the periphery circuit region; and performing a second ion implantation process to form a source and a drain for each MOS transistor in the periphery circuit region.

2. The method of claim 1 wherein the first dielectric layer is composed of silicon dioxide ($SiO_2$) and serves as the gate oxide layer for each MOS transistor.

3. The method of claim 1 wherein the protection layer is composed of silicon nitride.

4. The method of claim 3 wherein the protection layer also comprises a silicon-oxy-nitride ($SiO_xN_y$) layer, which is positioned at the bottom of the protection layer, and which serves as an anti-reflection coating (ARC) layer.

5. The method of claim 1 wherein after the formation of the source and the drain of each MOS transistor in the periphery circuit region, the method also comprises:

forming a metal layer on the surface of the semiconductor wafer, the metal layer covering the surfaces of the sources, the drains, and the gates in the periphery circuit region;

performing a first rapid thermal process (RTP);

performing a wet etching process to remove the portions of the metal layer that do not react with the surface of the semiconductor wafer; and performing a second rapid thermal process (RTP).

6. The method of claim 5 wherein the metal layer is composed of cobalt (Co), titanium (Ti), nickel (Ni), or molybdenum (Mo).

7. The method of claim 5 wherein the first rapid thermal process is performed at a temperature that is between 400° C. and 600° C. for a duration of 10 to 50 seconds, and the second rapid thermal process is performed at a temperature that is between 600° C. and 800° C. for a duration of 10 to 50 seconds.

8. A method for fabricating a metal oxide semiconductor (MOS) transistor of an embedded memory, the method comprising:

providing a semiconductor wafer with both a memory array area and a periphery circuit region defined on the surface of the silicon substrate of the semiconductor wafer, the memory array area comprising at least one cell-well, the periphery circuit region comprising at least one N-well and at least one P-well;

forming a first dielectric layer, an undoped polysilicon layer, a silicide layer, a doped polysilicon layer, a protection layer and a first photoresist layer respectively on the surface of the semiconductor wafer;

performing a first photolithographic process so as to define a plurality of gate patterns in the first photoresist layer above the cell-well of the memory array area;

using the gate patterns in the first photoresist layer as a hard mask to etch the protection layer down to the surface of the doped polysilicon layer;

removing the first photoresist layer;

forming a second photoresist layer on the surface of the semiconductor wafer;

performing a second photolithographic process to define a plurality of gate patterns in the second photoresist layer above the N-well and the P-well of the periphery circuit region;

using the gate patterns of the second photoresist layer and the remaining portions of the protection layer above the memory array area as a hard mask to etch the doped polysilicon layer, the silicide layer and the undoped polysilicon layer down to the surface of the dielectric layer so as to form gates for each MOS transistor in the memory array area and the periphery circuit region;

removing the second photoresist layer;

performing a first ion implantation process to form a lightly doped drain (LDD) for each MOS transistor;

forming a silicon nitride layer and a second dielectric layer in order on the surface of the semiconductor wafer;

performing an etching process to remove the second dielectric layer above the periphery circuit region and etching portions of the silicon nitride layer to form a spacer adjacent to each gate in the periphery circuit region; and performing a second and a third ion implantation process to form a source and a drain of each PMOS and NMOS transistor above the N-well and the P-well of the periphery circuit region.

9. The method of claim 8 wherein the first dielectric layer is composed of silicon dioxide ($SiO_2$) and serves as the gate oxide layer for each MOS transistor.

10. The method of claim 8 wherein the protection layer is composed of silicon nitride.

11. The method of claim 10 wherein the protection layer also comprises a silicon-oxy-nitride ($SiO_xN_y$) layer, which is positioned at the bottom of the protection layer, and which serves as an anti-reflection coating (ARC) layer.

12. The method of claim 11 wherein after the formation of the source and the drain of each MOS transistor in the periphery circuit region, the method also comprises:

forming a metal layer on the surface of the semiconductor wafer, the metal layer covering the surfaces of the sources, the drains, and the gates in the periphery circuit region;

performing a first rapid thermal process (RTP);

performing a wet etching process to remove the portions of the metal layer that do not react with the surface of the semiconductor wafer; and performing a second rapid thermal process (RTP).

13. The method of claim 12 wherein the metal layer is composed of cobalt (Co), titanium (Ti), nickel (Ni), or molybdenum (Mo).

14. The method of claim 12 wherein the first rapid thermal process is performed at a temperature that is between 400° C. and 600° C. for a duration of 10 to 50 seconds, and the second rapid thermal process is performed at a temperature that is between 600° C. and 800° C. for a duration of 10 to 50 seconds.

* * * * *